United States Patent
DeMarco et al.

(10) Patent No.: US 11,469,876 B1
(45) Date of Patent: Oct. 11, 2022

(54) TRIGGER TO DATA SYNCHRONIZATION OF GIGAHERTZ DIGITAL-TO-ANALOG CONVERTERS

(71) Applicant: Raytheon Company, Waltham, MA (US)

(72) Inventors: Joseph T. DeMarco, Tucson, AZ (US); Brendan W. Jacobs, Tucson, AZ (US)

(73) Assignee: Raytheon Company, Waltham, MA (US)

( * ) Notice: Subject to any disclaimer, the term of this patent is extended or adjusted under 35 U.S.C. 154(b) by 204 days.

(21) Appl. No.: 17/033,329

(22) Filed: Sep. 25, 2020

(51) Int. Cl.
H04L 7/033 (2006.01)
H04L 7/00 (2006.01)
G01S 7/285 (2006.01)
G01S 7/282 (2006.01)

(52) U.S. Cl.
CPC .............. *H04L 7/033* (2013.01); *G01S 7/282* (2013.01); *G01S 7/285* (2013.01); *H04L 7/0008* (2013.01); *H04L 7/0337* (2013.01)

(58) Field of Classification Search
CPC ..... H04L 7/033; H04L 7/0008; H04L 7/0337; G01S 7/282; G01S 7/285
See application file for complete search history.

(56) References Cited

U.S. PATENT DOCUMENTS

| | | | |
|---|---|---|---|
| 3,585,627 A * | 6/1971 | Christopher | G09G 1/10 345/25 |
| 3,774,201 A * | 11/1973 | Collins | G01S 13/64 324/76.15 |
| 3,786,504 A * | 1/1974 | Collins | G01S 7/2923 342/197 |
| 5,063,386 A * | 11/1991 | Bourdeau | G01S 13/784 342/40 |
| 5,867,535 A * | 2/1999 | Phillips | G01S 1/04 375/295 |

(Continued)

FOREIGN PATENT DOCUMENTS

| CN | 102882673 B | 3/2014 |
|---|---|---|
| CN | 106301378 A | 10/2019 |

OTHER PUBLICATIONS

International Search Report and Written Opinion of the International Searching Authority dated Jun. 16, 2021 in connection with International Patent Application No. PCT/US2021/017233, 11 pages.

(Continued)

*Primary Examiner* — James M Perez

(57) ABSTRACT

A method includes receiving, at a radar timing card, radar timing information and a synchronous clock signal. The method also includes generating, using the radar timing card, a timing trigger to indicate a time of transmission for radar return information. The method further includes receiving, at each of multiple digital-to-analog converter (DAC) channels of one or more DAC cards, the synchronous clock signal and the timing trigger. In addition, the method includes simultaneously transmitting, from each of the DAC channels, a dedicated portion of the radar return information based on the time of transmission indicated by the timing trigger. The synchronous clock signal is used to align the simultaneous transmissions of the DAC channels on the one or more DAC cards.

20 Claims, 5 Drawing Sheets

(56) References Cited

U.S. PATENT DOCUMENTS

| | | | | |
|---|---|---|---|---|
| 6,252,535 | B1* | 6/2001 | Kober | H03M 1/121 |
| | | | | 341/155 |
| 6,373,418 | B1* | 4/2002 | Abbey | H03M 3/416 |
| | | | | 341/143 |
| 7,312,737 | B2* | 12/2007 | Jungerman | H03M 1/662 |
| | | | | 341/144 |
| 7,769,105 | B1* | 8/2010 | McIntire | G01S 7/006 |
| | | | | 375/309 |
| 7,941,686 | B2* | 5/2011 | Fujisawa | H03L 7/00 |
| | | | | 713/320 |
| 7,978,109 | B1* | 7/2011 | Kuramochi | H03M 1/0624 |
| | | | | 341/120 |
| 8,233,412 | B1* | 7/2012 | Abbey | H04B 1/001 |
| | | | | 370/256 |
| 8,345,716 | B1* | 1/2013 | Ehret | H04B 7/10 |
| | | | | 455/562.1 |
| 8,774,196 | B2* | 7/2014 | Schmidt | H04B 7/0671 |
| | | | | 342/383 |
| 9,088,319 | B2* | 7/2015 | Peng | H03F 1/3241 |
| 9,191,127 | B2* | 11/2015 | Koli | H03H 19/008 |
| 9,350,377 | B1* | 5/2016 | Fetche | H03M 1/0863 |
| 9,531,432 | B2* | 12/2016 | Matic | H03M 1/125 |
| 9,577,657 | B1 | 2/2017 | Clara | H03M 1/109 |
| 9,590,663 | B2* | 3/2017 | Aono | H04L 27/2046 |
| 9,871,504 | B2* | 1/2018 | Clara | H03K 5/13 |
| 9,973,203 | B1* | 5/2018 | Azenkot | H03M 1/662 |
| 10,181,862 | B1* | 1/2019 | Marr | H03M 3/396 |
| 10,284,400 | B2* | 5/2019 | Tanio | H04B 1/04 |
| 10,516,412 | B1* | 12/2019 | Mehdizad Taleie | H03M 1/662 |
| 10,637,530 | B1* | 4/2020 | Levitan | H04L 7/041 |
| 10,742,226 | B1* | 8/2020 | Chen | H03M 1/1038 |
| 10,979,066 | B1* | 4/2021 | Huang | H03M 1/468 |
| 11,063,652 | B2* | 7/2021 | Xiong | H04W 72/082 |
| 11,115,260 | B2* | 9/2021 | Wang | H04L 27/2647 |
| 11,262,446 | B2* | 3/2022 | Speed | G01S 13/9076 |
| 2006/0119493 | A1* | 6/2006 | Tal | H03M 7/3017 |
| | | | | 341/143 |
| 2006/0203922 | A1* | 9/2006 | Rezeq | H03M 7/3022 |
| | | | | 375/247 |
| 2008/0198053 | A1* | 8/2008 | Tsang | H03M 1/0678 |
| | | | | 341/144 |
| 2009/0319245 | A1* | 12/2009 | Ivchenko | G01D 5/2291 |
| | | | | 703/13 |
| 2011/0299207 | A1* | 12/2011 | McMahill | H03K 17/0822 |
| | | | | 361/90 |
| 2012/0062286 | A1* | 3/2012 | Ginsburg | H03F 3/45188 |
| | | | | 327/147 |
| 2012/0114026 | A1* | 5/2012 | Nguyen | G01S 7/006 |
| | | | | 375/220 |
| 2012/0176190 | A1* | 7/2012 | Goodman | H03M 1/1052 |
| | | | | 327/551 |
| 2013/0234871 | A1* | 9/2013 | Eliezer | H03M 1/1009 |
| | | | | 341/120 |
| 2014/0161279 | A1* | 6/2014 | Jones | H04S 3/008 |
| | | | | 381/97 |
| 2014/0242914 | A1* | 8/2014 | Monroe | H04B 17/21 |
| | | | | 455/63.4 |
| 2015/0168540 | A1* | 6/2015 | Morita | G01S 13/0209 |
| | | | | 342/21 |
| 2015/0220100 | A1* | 8/2015 | Zhu | H03M 1/1009 |
| | | | | 327/539 |
| 2015/0223076 | A1* | 8/2015 | Santhoff | H04B 1/0017 |
| | | | | 375/219 |
| 2017/0207531 | A1* | 7/2017 | Murakowski | H01Q 21/22 |
| 2018/0175868 | A1* | 6/2018 | Stuhlberger | H03C 3/0941 |
| 2019/0280705 | A1* | 9/2019 | Bodnar | H03M 1/145 |
| 2020/0097038 | A1* | 3/2020 | Kinnerk | G06F 1/14 |
| 2020/0271775 | A1* | 8/2020 | Speed | G01S 7/034 |
| 2020/0348412 | A1* | 11/2020 | Durham | H01Q 21/28 |
| 2022/0014348 | A1* | 1/2022 | Papa | H04B 17/3913 |
| 2022/0091057 | A1* | 3/2022 | Gray | G01N 27/028 |
| 2022/0099798 | A1* | 3/2022 | DeMarco | G01S 7/4052 |

OTHER PUBLICATIONS

Liu et al., "Precisely synchronous and cascadable multi-channel arbitrary waveform generator," Review of Scientific Instruments, vol. 88, Issue 3, Mar. 2017, 14 pages.

Yuan et al., "Design and implementation of multi-channel moving target radar signal simulator," Journal of Engineering, vol. 2019, No. 19, Jul. 2019, 4 pages.

* cited by examiner

TRIGGER TO DATA SYNCHRONIZATION OF GIGAHERTZ DIGITAL-TO-ANALOG CONVERTERS

TECHNICAL FIELD

This disclosure is directed in general to radar systems. More specifically, this disclosure relates to a trigger to data synchronization of gigahertz digital-to-analog converters.

BACKGROUND

Modern radar target scene generation systems typically need to have signals between components synchronized for effective radar scene generation. One problem related to synchronization is real-time radio frequency (RF) scene generation for hardware-in-the-loop (HWIL) applications, where misalignment and uncertainty of signals can decrease fidelity and cause range, angle and fidelity errors in a radar system's interpretation of synthesized radar returns. Gigahertz digital-to-analog converters (DACs) possess characteristics that make them difficult to align to each other and to an external trigger and get deterministic timing. The problem becomes more difficult if multiple DACs are located on separate circuit cards. For example, a high-speed serial input of a DAC is often in a different clock domain than an output sample clock of the DAC. The DACs may therefore rely on internal phase-locked loops (PLLs) to generate internal clocks from an external source. This creates uncertainty regarding when each DAC is initialized due to variances in PLL stability. Additionally, the external trigger meant to synchronize the DACs outputs may be on yet another clock domain, adding to the uncertainty of trigger to analog data output timing.

SUMMARY

This disclosure provides a trigger to data synchronization of gigahertz digital-to-analog converters.

In a first embodiment, a method includes receiving, at a radar timing card, radar timing information and a synchronous clock signal. The method also includes generating, using the radar timing card, a timing trigger to indicate a time of transmission for radar return information. The method further includes receiving, at a digital-to-analog converter (DAC) channels of one or more DAC cards, the synchronous clock signal and the timing trigger. In addition, the method includes simultaneously transmitting, from each of the DAC channels, a dedicated portion of the radar return information based on the time of transmission indicated by the timing trigger. The synchronous clock signal is used to align the simultaneous transmissions of the DAC channels on the one or more DAC cards.

In a second embodiment, an apparatus includes a radar timing card and multiple DAC channels on one or more DAC cards. The radar timing card is configured to receive radar timing information and a synchronous clock signal and generate a timing trigger to indicate a time of transmission for radar return information. Each DAC channel is configured to receive the synchronous clock signal, receive the timing trigger, and transmit a dedicated portion of the radar return information based on the time of transmission indicated by the timing trigger. The apparatus is configured to use the synchronous clock signal to align the simultaneous transmissions of the DAC channels on the one or more DAC cards.

In a third embodiment, a system includes a missile stack unit, a clock synchronizer, and a closed-loop radar computer. The missile stack unit is configured to generate a system clock signal. The clock synchronizer is configured to convert the system clock signal into a synchronous clock signal. The closed-loop radar computer includes a radar timing card and multiple DAC channels on one or more DAC cards. The radar timing card is configured to receive radar timing information and the synchronous clock signal and generate a timing trigger to indicate a time of transmission for radar return information. Each DAC channel is configured to receive the synchronous clock signal, receive the timing trigger, and transmit a dedicated portion of the radar return information based on the time of transmission indicated by the timing trigger. The closed-loop radar computer is configured to use the synchronous clock signal to align the simultaneous transmissions of the DAC channel on the one or more DAC cards.

Other technical features may be readily apparent to one skilled in the art from the following figures, descriptions, and claims.

BRIEF DESCRIPTION OF THE DRAWINGS

For a more complete understanding of this disclosure, reference is now made to the following description, taken in conjunction with the accompanying drawings, in which.

DETAILED DESCRIPTION

Figure 1:
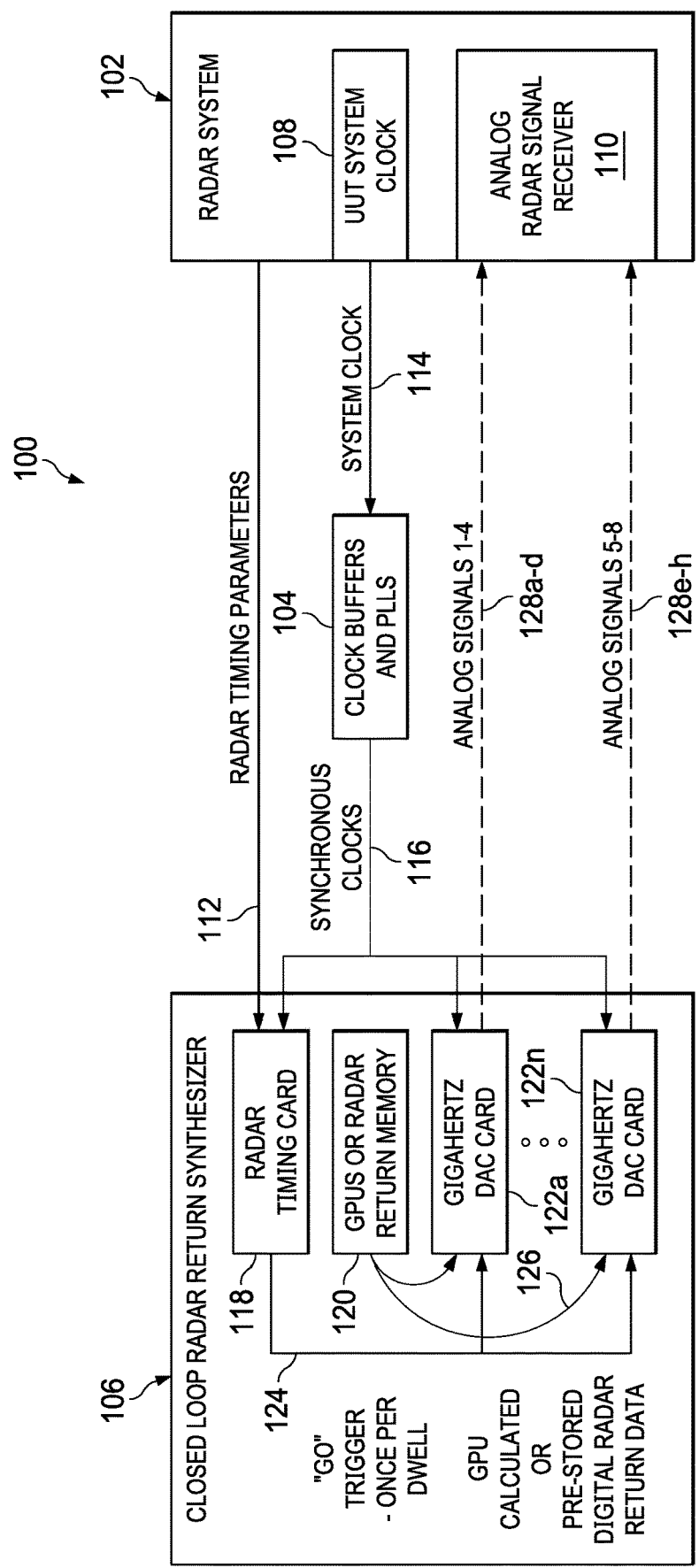
FIG. 1 illustrates an example system for performing a trigger to data synchronization of gigahertz digital-to-analog converters according to this disclosure.

FIGS. 1 through 6, described below, and the various embodiments used to describe the principles of the present disclosure in this patent document are by way of illustration only and should not be construed in any way to limit the scope of the disclosure. Those skilled in the art will understand that the principles of the present disclosure may be implemented in any type of suitably arranged device or system.

For simplicity and clarity, some features and components are not explicitly shown in every figure, including those illustrated in connection with other figures. It will be understood that all features illustrated in the figures may be employed in any of the embodiments described. Omission of a feature or component from a particular figure is for purposes of simplicity and clarity and is not meant to imply that the feature or component cannot be employed in the embodiments described in connection with that figure. It will be understood that embodiments of this disclosure may include any one, more than one, or all of the features described here. Also, embodiments of this disclosure may additionally or alternatively include other features not listed here.

The use of gigahertz digital-to-analog converters (DACs) for creating synthesized pulsed radar return signals for hardware-in-the-loop testing is challenging. Aligning multiple gigahertz DAC output channels across multiple devices and circuit cards is notoriously difficult. For example, a timing relationship between all DAC outputs and an external time trigger signal being synchronized and aligned typically needs to be deterministic and repeatable across multiple coherent processing intervals (CPIs), consisting of multiple pulse repetition intervals (PRIs). The external time trigger signal is used to align synthesized radar return data to a radar receive window.

Some previous attempts include alignment of channels by modifying sample clock signals provided to different DAC outputs. These attempts help channel-to-channel alignment but not trigger-to-channel alignment. Other previous attempts reset the DACs until a phase alignment of internal sample clock phase-locked loops (PLLs) are in phase. These attempts also help channel-to-channel alignment but not trigger-to-channel alignment. Yet other previous attempts involve a hardware solution to obtain channel-to-channel alignment by constantly reinitializing the DACs until all DACs are aligned. Once again, these attempts help channel-to-channel alignment but not trigger-to-channel alignment. Still other attempts involve resetting a high-speed serial link to each DAC to bring the DACs all up at similar times. These attempts improve channel-to-channel alignment for a single card but not trigger-to-channel alignment or even channel-to-channel alignment across multiple DAC circuit cards. Scaling of these previous attempts to many cards and channels is challenging, if not practical. This disclosure provides various techniques for triggering data synchronization of gigahertz DACs that overcome these or other issues. These techniques' are easily scaled across numerous DAC circuit cards and channels.

FIG. 1 illustrates an example system 100 for performing a trigger to data synchronization of gigahertz digital-to-analog converters (DACs) according to this disclosure. As shown in FIG. 1, the system 100 includes a radar system 102, a clock distribution electronics 104, and a closed-loop radar return synthesizer 106. The system 100 enables trigger-to-channel synchronization and channel-to-channel synchronization. The system 100 also supports deterministic timing that only needs to be calibrated once and that eliminates clock drift between components and reduces uncertainty in radar return timing.

The radar system 102 represents a radar system, missile system, or the like that is undergoing operation in the system 100. In some embodiments, the radar system 102 may represent a ground-based radar system that is installed in a fixed position on land or on a ground vehicle. In other embodiments, the radar system 102 may represent a radar system disposed in or on an aircraft or spacecraft, such as a missile. In the example shown in FIG. 1, the radar system 102 represents an eight-channel radar system, although this is merely for illustration only. Other numbers of channels are possible (such as a six-channel radar system) and within the scope of this disclosure. Additionally, the use of a transmitting antenna driven by each DAC channel to form an antenna array to present the radar return scene to the radar systems antenna(s) is possible, in place of illustration which depicts the DACs driving into the radar system's receiver's electrical analog inputs.

In this example, the radar system 102 includes a radar system clock 108 and an intermediate frequency (IF) receiver 110. The radar system 102 also includes processing circuitry, memory, or other component(s) configured to output radar timing parameters 112. For example, the radar system 102 can generate a signal that is reflected off a target surface and can detect the reflected signal, and different information related to the generated signal can be output as the radar timing parameters 112.

The radar system clock 108 represents a clock installed in the radar system 102 to maintain synchronicity between different functions within the system 100. For example, the radar timing parameters 112 can include the current time and future timing information for when the radar system's radar return receive windows will be active. The radar system clock 108 can also output a system clock signal 114 to one or more components within the closed-loop radar return synthesizer 106 using clock distribution electronics 104.

The clock distribution electronics 104 operates to ensure that the radar system 102 and the closed-loop radar return synthesizer 106 have synchronized clocks or use the same clock signal from the radar system clock 108. This enables the closed-loop radar return synthesizer 106 to output analog signals to the radar system 102 at precisely the right times by maintaining the same time reference between the radar system 102 and the closed-loop radar return synthesizer 106. For example, in one aspect of operation, the clock distribution electronics 104 receives a system clock signal 114 from the radar system 102, distributes a synchronous clock signal 116 to the closed-loop radar return synthesizer 106 components.

In this example, the closed-loop radar return synthesizer 106 includes a radar timing card 118, multiple graphics processing units (GPUs) or computer processors 120, and multiple DAC cards 122a-122n. The closed-loop radar return synthesizer 106 can receive radar timing parameters 112 from the radar system 102 and the synchronous clock signal 116 from the clock distribution electronics 104. As described in greater detail below, the closed-loop radar return synthesizer 106 calculates radar return information in a timeframe that is short enough so that an output is processed as synchronized outputs over multiple channels. The number of generated radar returns that may be produced by the system 100 in FIG. 1 may be limited only by the number and performance of the computer processors 120 and the required time available. Thus, the system 100 is scalable for testing of simple to highly-complex radar scenes. The calculations and functions performed within the system 100 are distributed across the components of the system 100 according to the capabilities of each component so as to optimize the performance of the system 100 as a whole.

The radar timing card 118 may be communicatively coupled to the radar system 102 via a wired or other suitable communication interface. The radar timing card 118 generally operates to collect radar scene information from the radar system 102, such as radar waveform information and radar timing parameters 112. The radar scene information is used by the closed-loop radar return synthesizer 106 to understand the type and timing of radar signals that are used so that the closed-loop radar return synthesizer 106 can generate radar return information 126. After receiving the radar scene information from the radar system 102, the radar timing card 118 can process the radar timing parameters from the radar system 102 and provide them to the computer processor 120. Based on the radar timing parameters the computer processor 120 generates radar return information 126. Based on the radar timing parameters 112, the radar timing card 118 can also generate a timing trigger 124 to enable a transmission of information from the DAC cards 122a-122n. The timing trigger 124 can be based on a combination of the radar timing parameters 112 and the synchronous clock signal 116.

The trigger distribution electronics 204 operates to distribute the timing trigger 124 to the DAC cards 122a-122n. The trigger distribution electronics 204a-204n or the DAC cards 122a-122n can also include configurable delay logic to adjust the DAC cards 122a-122n timing trigger 124 to the synchronous clock signal 116 sampling set-up time, such that receipt of the timing trigger 124 by the DAC cards 122a-122n is deterministic without metastability. This ensures that the receipt of the timing trigger 124 by the DAC cards 122a-122n is deterministic and does not vary by one or more synchronous clock signal 116 periods.

The computer processor 120 represents any suitable structure configured to receive radar timing information and process radar scene information and generate tasks. For example, the computer processor 120 can include or represent one or more processing devices, such as one or more microprocessors, microcontrollers, digital signal processors (DSPs), application specific integrated circuits (ASICs), GPUs, field programmable gate arrays (FPGAs), or discrete circuitry. In some embodiments, the computer processor 120 can include commercial-off-the-shelf (COTS) central processing units (CPUs), such as CPUs from INTEL or other manufacturer. Also, in some embodiments, the computer processor 120 can operate according to instructions stored in a memory. The memory can also store data associated with radar scene information and radar return information. The memory represents any structure(s) capable of storing and facilitating retrieval of information (such as data, program code, and/or other suitable information on a temporary or permanent basis). The memory may represent a random access memory or any other suitable volatile or non-volatile storage device(s).

The computer processor 120 use the radar timing parameters 112 and a three-dimensional physics model of a scene and combine the information to calculate radar return information 126 for the radar system 102. The computer processor 120 operates to generate digitally-synthesized signals that make up the calculated radar return information 126, including an aggregate of signal characteristics, such as Doppler frequencies, phases, and signal delays. The calculated radar return information 126 shows what the radar system 102 might "see" based on the radar scene information collected by the radar timing card 118. The calculated radar return can include simple or highly-complex scenes, including one or more extended targets, clutter, one or more electronic attack (EA) effects, and the like. In some embodiments, the computer processor 120 has suitable processing power to generate radar return information 126 within the time of receipt of the radar timing parameters 112 and when the radar system 102 activates its receive window for real time computing.

The DAC cards 122a-122n operate to convert the digitally-synthesized signals associated with the calculated radar return information 126 into analog signals that the radar system 102 can actually receive and process. Each DAC card 122a-122n is associated with a group of corresponding radar channels 128a-128h of the radar system 102. That is, each DAC card 122a-122n generates analog signals to be transmitted over a subset of the radar channels 128a-128h. Each DAC card 122a-122n represents any suitable structure configured to convert digital signals into analog signals. In some embodiments, each DAC card 122a-122n includes one or more GigaHertz-sample rate DACs, although other suitable DACs are possible and within the scope of this disclosure.

In some embodiments, the DAC cards 122a-122n generate analog signals at an intermediate frequency (IF) for injection into an interface of the radar system 102. As known in the art, IF is often utilized in radar systems when going from digital-to-analog in accordance with the super heterodyne principle. In the system 100, instead of the DAC cards 122a-122n converting the digital signals to analog signals at a radio frequency (RF)—only to have a receiver at the radar system 102 convert the analog signal back to IF—the DAC cards 122a-122n can generate each analog signal at the IF. If necessary, any RF up-conversion, down-conversion, and propagation steps can be simulated computer processor 120. Of course, generating analog signals at IF is merely one example implementation. In general, the system 100 is frequency-independent and can simulate radar return signals or other types of signals at any suitable frequency or frequencies.

The IF receiver 110 receives the IF analog signals carried over the radar channels 128a-128h and operates to condition (such as by attenuation or amplification) each analog signal to better accommodate the specifications of the radar system 102. For example, in some tests, the radar system 102 can exhibit limited dynamic range. In such cases, if the analog signals from the DAC cards 122a-122n are too strong, the IF receiver 110 can attenuate the signals. Once the analog signals are received by the IF receiver 110, the radar system 102 can process the analog signals, interpret the calculated radar return information 126 contained in the signals, and make any operational adjustments as needed. Operational changes by the radar system 102 may then be fed back to the radar timing card 118 in a real-time closed-loop manner. In some embodiments, the IF receiver 110 is the same interface that a radar antenna would connect to when the radar system 102 operates in a real-world environment (not during testing).

In some embodiments, the system 100 can perform timing and synchronization of signals via a waveform timing alignment technique. Using this technique, the system 100 can achieve waveform time alignment of less than ½ the DACs' sample clock period and phase alignment limited to the phase offset resolution of the DACs used, for the analog signals transmitted across the radar channels 128a-128h.

Using the components shown in FIG. 1, the system 100 enables full operational test coverage of the radar system 102. The system 100 provides much greater operational flexibility over conventional analog systems. Radar and kinematic scenarios can be easily updated in the system 100 via simple software or data updates. For example, the system 100 can be readily updated to add, change, or remove radar return signals associated with one or more scatterers, weather objects, clutter, EA effects, and the like (no hardware changes are needed). Calibration of the system 100 is simplified and can be performed in minutes. In contrast, in a conventional analog system, a new scene might require new racks of hardware to simulate and require weeks to calibrate. The system 100 is fully scalable both in the frequencies used and in the number of receiver channels. Components (such as the radar timing card 118, computer processor 120, DAC cards 122a-122n, radar channels 128a-128h, and the like) can be added or removed to scale the system 100 as needed.

Although FIG. 1 illustrates one example of a system 100 for performing a trigger to data synchronization of gigahertz digital-to-analog converters, various changes may be made to FIG. 1. For example, the system 100 may include any suitable numbers of processing devices, DAC cards and, radar timing cards. In general, the makeup and arrangement of the system 100 are for illustration only. Components may be added, omitted, combined, rearranged, or placed in any other configuration according to particular needs.

Figure 2:
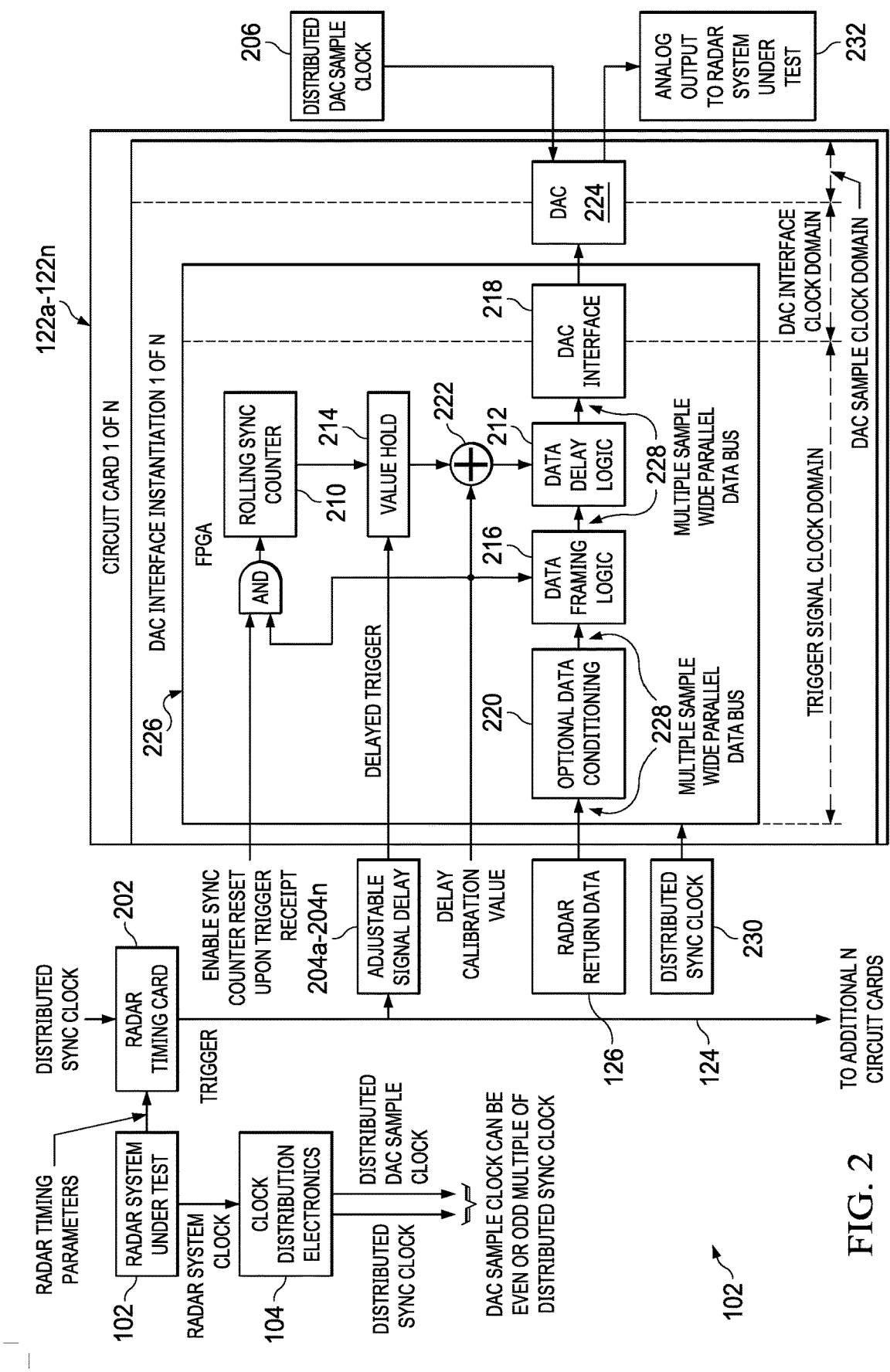
FIG. 2 illustrates example Giga Hertz sample rate digital-to-analog converter cards with signals and logic functions according to this disclosure.

FIG. 2 illustrates example GHz-sample rate DAC cards 122a-122n according to this disclosure. As shown in FIG. 2, the clock distribution electronics 104, a radar timing card 202, and a plurality of trigger distribution electronics 204a-204n are used to support the DAC cards 122a-122n. Each of the DAC cards 122a-122n includes a minimum of one of the following: rolling sync counter 210, data delay logic 212, value hold logic 214, data framing logic 216, DAC Interface 218, optional data conditioning logic 220, delay calibration offset logic 222, DAC channel 224, and DAC sample clock 206.

In this example, the system clock 108 generated by the radar system 102 is a common clock source for the DAC cards 122a-122n. This provides a synchronous system where all clock signals in a synthesized radar return system are derived from a single system clock synchronous to a radar system. Here, each DAC sample clock 206 operates at a much higher frequency than the frequency at which the FPGA 226 can operate, and a high-speed DAC interface 218, such as an IEEE JESD interface or similar, is utilized. The FPGA 226 utilizes parallel, multi-sample wide parallel buses 228 to provide data to the DAC interface 218 as the required DAC sample rates.

The radar timing card 202 is configured to be coupled to the radar system 102, such as via one or more cables or other suitable physical or wireless interface. The radar timing card 202 generally operates to collect radar timing parameters from the radar system 102 which are used to generate a trigger signal at the appropriate time to start the presentation of radar return information by the DAC cards 122a-122n. The radar timing parameters are used to understand the type and timing of radar signals that are to be tested, which allows the system 100 to then generate suitable radar return data 126 at the correct time relative to the trigger signal.

The DAC cards 122a-122n sample an external timing trigger 124 using the distributed synchronous clock signal 116. Upon receipt of an external timing trigger 124 at a first clock frequency and provide data to initialized high-speed DAC channels 224 operating at a much higher clock frequency. Rolling sync counters 210, data framing logic 216, value hold logic 214, data delay logic 212 frame high-speed DAC input interface data, and additional logic translates the receipt of the timing trigger 124 on the trigger signal clock domain 230 to a trigger to data output time that remains deterministic thru multiple clock domain crossings. The timing relation of the external timing trigger signal 124 to the value of a rolling sync counter 210 determines the amount of delay from trigger distribution electronics 204a-204n that is applied to the radar return information 126 for an entire dwell time, where the dwell time is an amount of time that a radar system collects data for a predetermined processing interval.

Trigger-to-output and output-to-output alignment can be achieved by pushing data to the DAC channels 224 in a deterministic way. The time represented by each DAC data frame is an integer multiple of a rate of the external timing trigger signal 124. A repeating sync counter 210 is implemented at a rate of the trigger clock domain 130 and counts to a multiple of a rate of the external timing trigger signal 124 and a rate of the DAC sample clock signal 206. When an external trigger occurs, the value of the counter is stored. The value of the timer is used to relate trigger "time" to DAC "sample time" and then generate a delay value, which is a number of samples to delay the data within a data frame.

The radar return information 126 provided to the DAC cards 122a-122n is shifted, resulting in a timing delay of radar return information 126 linearly proportional to when the timing trigger 124 arrived relative to the sync counter 210 on all data frames for the radar return information 126. For example, if the data arrives when the sync counter 210 is at a starting value, the resulting delay would be zero samples. If the timing trigger 124 arrives at the end of the sync count, the data would be delayed by close to a full data frame. This approach allows for synchronization and calibration across multiple DAC cards 122a-122n and DAC channels 224.

A test mode can be implemented in a manner that the sync counters 210 can be reset upon the receipt of the external timing trigger 124. This synchronizes the sync counters 210 of all DAC cards 122a-122n. The sync counter value when the timing trigger 124 is received can be stored, such as in a software-readable location. If the stored sync counter trigger values for multiple FPGAs or DAC cards 122a-122n are different, the trigger delays to the system can be calibrated, such as by using external hardware. The process can be repeated until all FPGAs or DAC cards 122a-122n have a same sync count trigger values and their sync counters 210 are fully synchronized.

At that point, all DAC outputs from trigger-to-output would be fully deterministic. The timing from trigger-to-output is measured for each DAC channel output 232. The DAC output-to-output alignment can then be adjusted by sample width increments implementing sample delay logic 222 within the DAC cards 122a-122n, and sample period precision control can be achieved by shifting data within a data frame. Course precision can be achieved by simply inserting or deleting entire data words and using a first-in-first-out (FIFO) queue as an elastic buffer. The accuracy achieved with this approach is less than or equal to one half of a period of the DAC sample clock signal 206, which is sufficient for most applications.

Although FIG. 2 illustrates one example of Giga Hertz—sample rate DAC cards 122a-122n, various changes may be made to FIG. 2. For example, as discussed above, while each of the DAC cards 122a-122n includes various components and certain numbers of components, other embodiments may include different numbers of any or all of these components. In general, the makeup and arrangement of the Giga Hertz sample rate DAC cards 122a-122n are for illustration only. Components may be added, omitted, combined, or placed in any other configuration according to particular needs. For example, many FPGAs utilize internal input and output delay logic. The adjustable signal delay 204a-204n could exist within the FPGA if the appropriate FPGA component is used.

Figure 3:
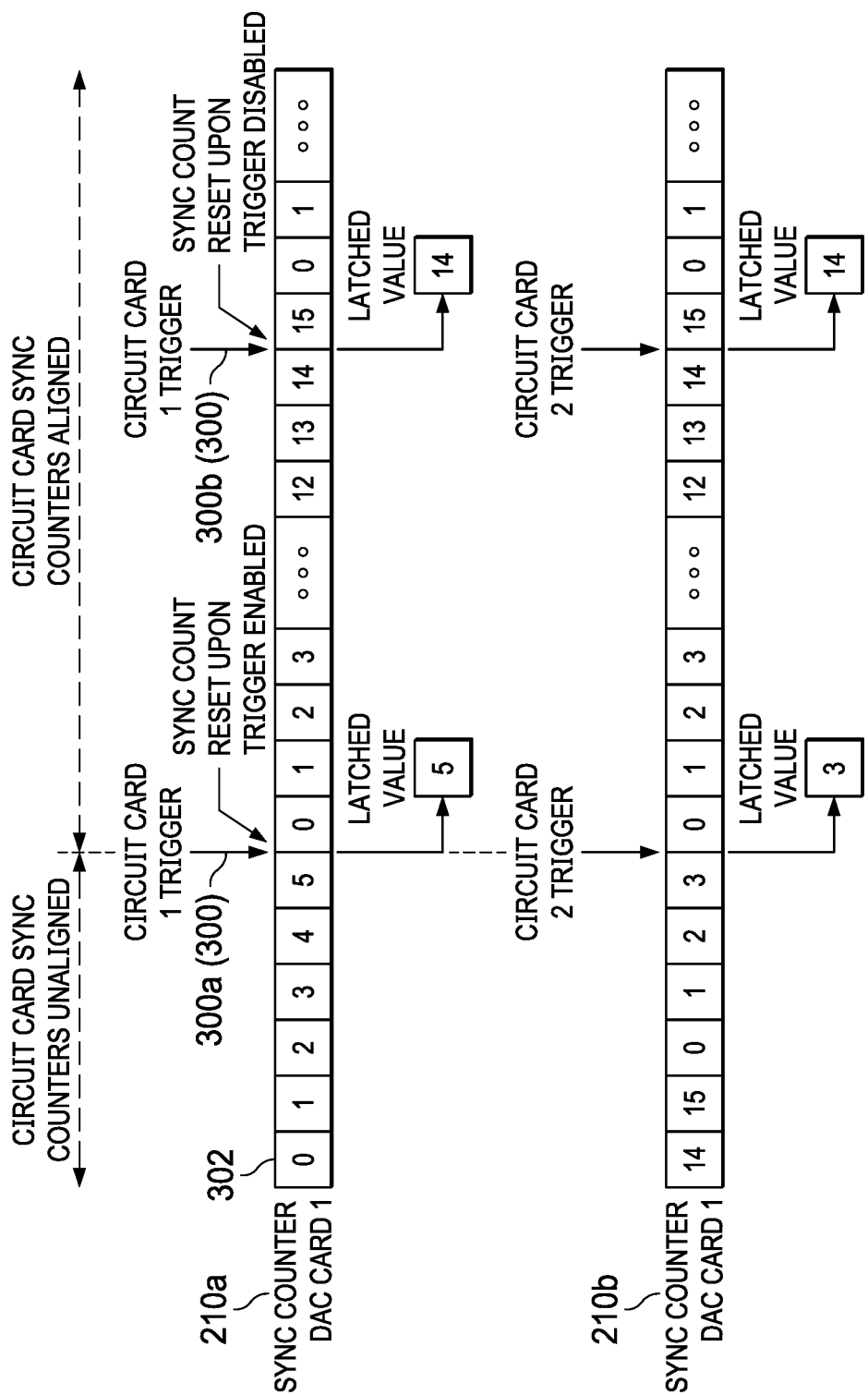
FIG. 3 illustrates an example of rolling sync counters on multiple digital-to-analog converter cards are synchronized with an external trigger according to this disclosure.

FIG. 3 illustrates an example of rolling sync counters on multiple digital-to-analog converter cards are synchronized with an external trigger according to this disclosure. As shown in FIG. 3, the processing of sync counters 210 in FIG. 2 are synchronized.

In this example, the rolling sync counters 210a and 210b range from zero to fifteen. First, both DAC Cards are placed in a sync mode that enables the sync counters to be reset upon receipt of the trigger 300. The sync counter 210a and 210b on each board is initially not synchronized; the count values 302 are not known to be the same values at any given time. Upon receipt of the trigger 300, sync counters 210a and 210b on both DAC Cards are reset to the same value. The value of the sync counters 210a and 210b are latched upon receipt of the trigger 300 in an accessible memory location. The values upon receipt of the first trigger 300a may not be the same. Upon receipt of the second trigger 300b the sync counters 210a and 210b are latched again in an accessible memory location. The values on all DAC cards 122a-122n can be compared to test for synchronicity. If the values are equal, the receipt of the triggers 300 for all boards are synchronized. If the values are not equal, the receipt of the triggers 300 for boards are not synchronized. The adjustable trigger distribution electronics 204a-204n can be adjusted such that the latched triggered sync counter values are identical for all DAC cards 122a-122n. Additionally, the synchronization process can be repeated to test for trigger sample metastability, and the adjustable signal delays modified to optimize trigger to trigger signal clock domain setup time to remove any metastable effects. Once all the DAC card rolling sync counters 210 are synchronized the latched sync counter value upon receipt of the trigger can be used to adjust the data delay logic to achieve deterministic trigger to data output timing.

Although FIG. 3 illustrates one example of synchronizing rolling sync counters 210, various changes may be made to FIG. 3. For example, different rolling sync counter ranges and values could be used. The rolling sync counter could utilize any repeating sequence with a fixed period. In general, the counting sequence and the relationship between receipt of trigger and the data being latched is for illustration only.

Figure 4:
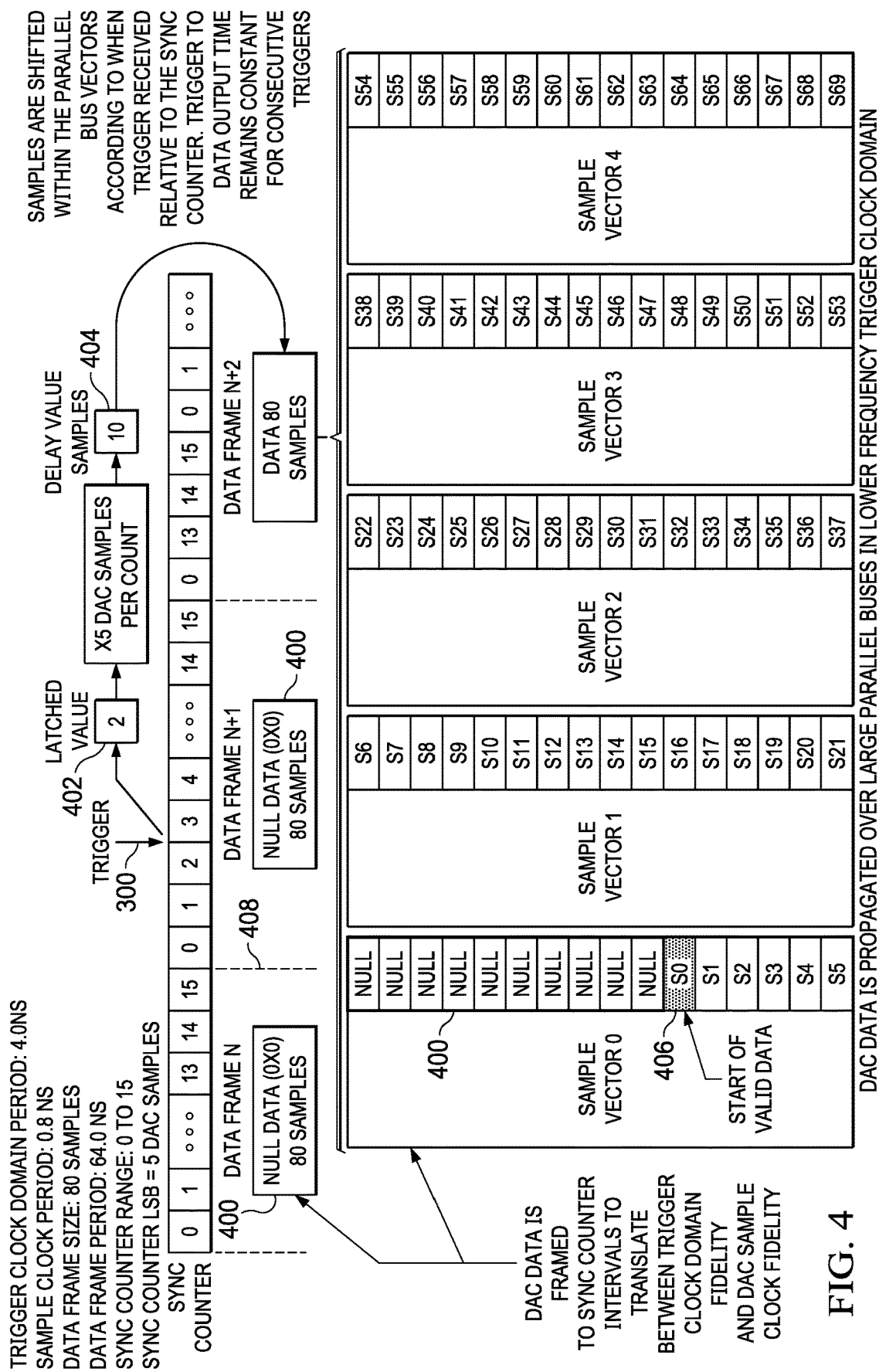
FIG. 4 illustrates an example of how the logic maintain deterministic trigger to output data timing according to this disclosure.

FIG. 4 illustrates an example of how the logic maintain deterministic trigger to output data timing according to this disclosure. As shown in FIG. 4, the latched sync counter value is used to adjust the data delay logic to achieve deterministic trigger to data output timing.

In this example, the trigger clock domain period is 4 nanoseconds and the DAC sample clock period is 0.8 nanoseconds. The data frame size has been set to 80 DAC samples, and the data frame period has been set to 64 nanoseconds. Given these parameters, the sync clock has 16 values, 0 to 15, such that incrementing 16 times at a 4 nanosecond trigger clock domain period requires the data frame period of 64 nanoseconds. The relation between the trigger clock domain and DAC clock domain precision is the quotient of the 4 nanosecond trigger clock domain period divided by the 0.8 ns DAC sample clock period, resulting in a ratio of 5 DAC sample periods for every trigger clock domain period. The trigger clock domain periods are counted using the rolling sync counters 210, which are used as the reference point for both trigger and DAC data.

Once the DAC cards 122a-122n are powered up and DAC interfaces are initialized, the DAC cards 122a-122n are always framing and output data. Prior to receipt of DAC data, and a trigger, the DAC cards 122a-122n output null data 400. Upon receipt of the DAC data, the DAC cards 122a-122n can continue to output null data 400 until a trigger 300 is received. When a trigger 300 is received the rolling sync counter value is latched. The ratio of trigger clock domain period to DAC sample clock period is applied to the latched value 402 to determine the delay value 404, in number of samples, applied to the start of valid DAC data. Because the DAC sample clock 206 is a much higher frequency than the FPGA 226 can support, the DAC data path is parallelized into multiple sample wide buses. In the example shown in FIG. 4, the data frame consists of 5 data vectors, 16 samples wide each, on a 16 sample wide data bus. The latched rolling sync counter value is 2, resulting in a data delay value 404 of 10 samples. The data delay value 404 and the DAC data are applied to the subsequent data frame. The start of valid DAC data 406, S0 (sample0), begins after the 10 null samples, starting on the eleventh sample. If the trigger 300 occurs later in the data frame period 408, the latched rolling sync counter value 402 will be greater, resulting in a proportional valid sample delay value 404 in the DAC sample data. The result is that the valid DAC data is always provided to the DAC one frame period 408 from the receipt of the trigger, plus fixed propagation delays from the DAC interface 218 to the DAC analog output 232. In this example, the frame period 408 is 64 nanoseconds. Therefore, the valid DAC data is always output 64 nanoseconds after receipt of the trigger 300, plus fixed total propagation delay from the input of the DAC interface 218 to the DAC analog output 232. The delay values 404 from the input of the DAC interface 218 to the DAC output are fixed overall due to all clock domains being synchronous to the system clock 108.

Once the trigger-to-data output timing is fixed, the delay calibration value and DAC (if available) can be utilized to adjust the delay of individual DAC channels 224 to align all channels in a multi-channel system across one or more DAC cards 122a-122n.

Although FIG. 4 illustrates one example of obtaining a fixed and deterministic trigger to DAC data output timing relationship, various changes may be made to FIG. 4. For example, different rolling sync counter 210 ranges and values could be used. The rolling sync counter could utilize any repeating sequence with a fixed period. In general, the counting sequence and the relationship between receipt of trigger and the data being latched is for illustration only The data frame size, data frame rate, data bus sample wide, DAC sample clock period and trigger clock period can all be adjusted to obtain optimal performance per the system requirements.

This solution may be useful for real-time pulsed radar hardware-in-the-loop simulation. It is also scalable to any number of DAC cards 122a-122n and DAC channels 224, which support IF injection and RF chamber applications. For example, being able to provide triggered RF return data with a deterministic and controllable time delay may be needed for the accurate real-time hardware-in-the-loop testing of pulsed radar systems with variable CPI-to-CPI timing. One example of this type of technique is described in the Applicant's co-pending patent application Ser. No. 17/033,257, which is hereby incorporated by reference in its entirety. The trigger-to-data alignment solution for synchronizing multiple DAC systems is novel due to a scalable FPGA solution that does not require specialized card circuitry, phase delay of clocks, etc. The trigger-to-data alignment solution also achieves accuracy that is practical and sufficient for real-time hardware-in-the-loop radar simulations at RF and IF. Calibration can occur once per run and be automated in seconds.

Figure 5:
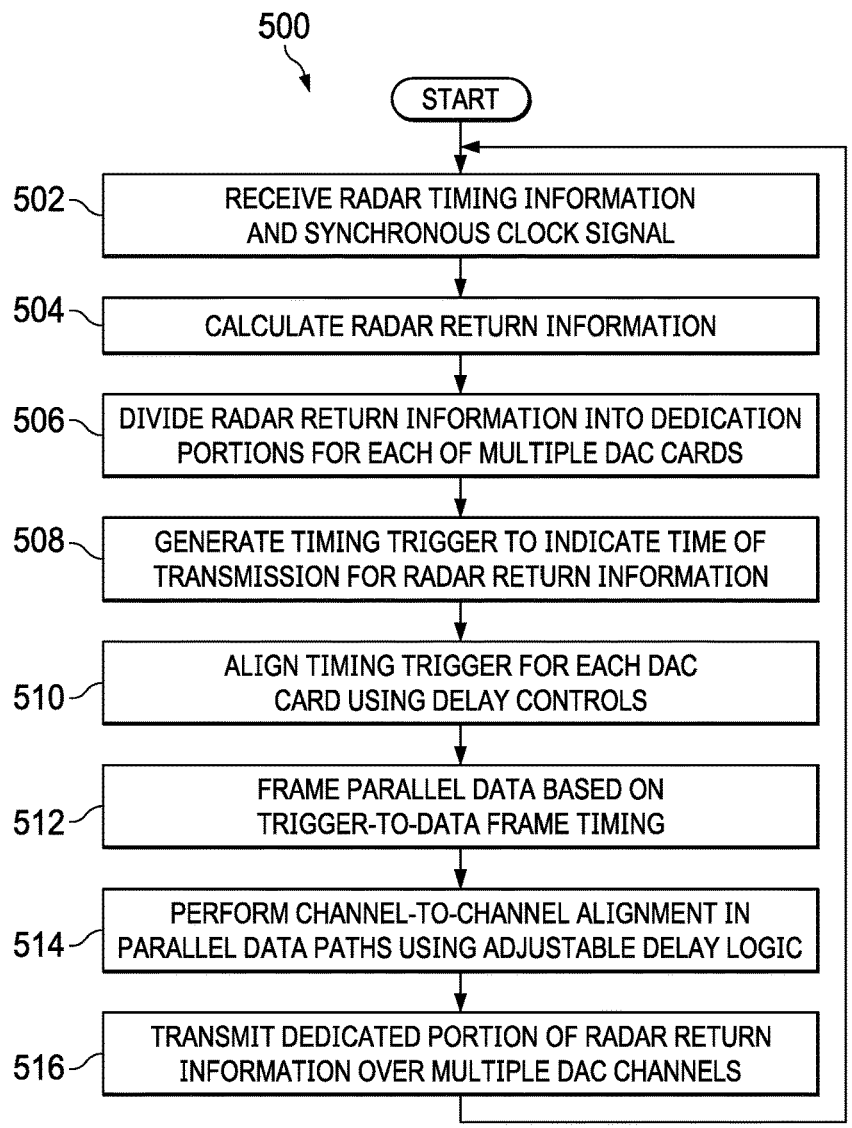
FIG. 5 illustrates an example method for performing a trigger to data synchronization of gigahertz digital-to-analog converters according to this disclosure.

FIG. 5 illustrates an example method 500 for performing a trigger to data synchronization of gigahertz digital-to-analog converters according to this disclosure. For ease of explanation, the method 500 is described as being performed using the system 100 of FIG. 1. However, the method 500 may be used with any other suitable device or system.

As shown in FIG. 5, radar timing information and a synchronous clock signal are received step 502. This may include, for example, a closed-loop radar return synthesizer 106 receiving radar timing parameters 112 from a radar system 102. The radar timing parameters 112 can include information related to a radar pulse generated and sensed by the radar system 102. This may also include the closed-loop radar return synthesizer 106 receiving a synchronous clock signal 116. For instance, the radar system 102 may operate a system clock 108 that produces a system clock signal 114, which is output to clock distribution electronics 104. The clock distribution electronics 104 can convert the system clock signal 114 into the synchronous clock signals 116 and DAC sample clock signals. The synchronous clock signal 116 can be simultaneously transmitted to a radar timing card 118 and multiple DAC cards 122a-122n of the closed loop radar return synthesizer 106.

Radar return information is calculated using the computer processor 120 generating radar return information 126, which is based on the information processed from the radar timing parameters 112, at step 504. The radar return information is divided into dedicated portions for DAC cards using the at the computer processor 120 at step 506. This may include, for example, the computer processor 120 dividing the radar return information 126 in any suitable manner, such as temporally or by amount of data.

A timing trigger is generated to indicate a time of transmission for the radar return information using a radar timing card at step 508. This may include, for example, generating the timing trigger 124 based on the radar timing parameters 112 received from the radar system 102. The timing trigger 124 can indicate a current time or a future time for transmission of the radar return information 126. The timing trigger is aligned for each DAC card using delay controls at step 510. This may include, for example, using the trigger distribution electronics 204a-204n (which are located on transmission paths for the timing trigger 124), where each trigger distribution electronics 204a-204n corresponds to one of the DAC cards 122a-122n. Parallel data is framed based on a trigger-to-data frame timing using a sync counter on each of the DAC cards at step 512. Here, the trigger-to-data frame timing aligns frames used to transmit the radar return information 126. Channel-to-channel alignment is performed on parallel data paths using adjustable delay logic at step 514. This may include, for example, using the adjustable delay logic 212 to ensure that each DAC channel 224 transmits the dedicated portion of the radar return information 126 in unison across the multiple DAC cards 122a-122n. The dedicated portion of the radar return information 126 is transmitted over each of the DAC channels at step 516. Here, the radar return information 126 is simultaneously transmitted on each of the DAC channels 224 with a controlled and deterministic trigger to output delay.

Although FIG. 5 illustrates one example of a method 500 for generating a trigger to data synchronization of gigahertz digital-to-analog converters, various changes may be made to FIG. 5. For example, while shown as a series of steps, various steps shown in FIG. 5 may overlap, occur in parallel, occur in a different order, or occur multiple times. Moreover, some steps may be combined or removed and additional steps may be added according to particular needs.

Figure 6:
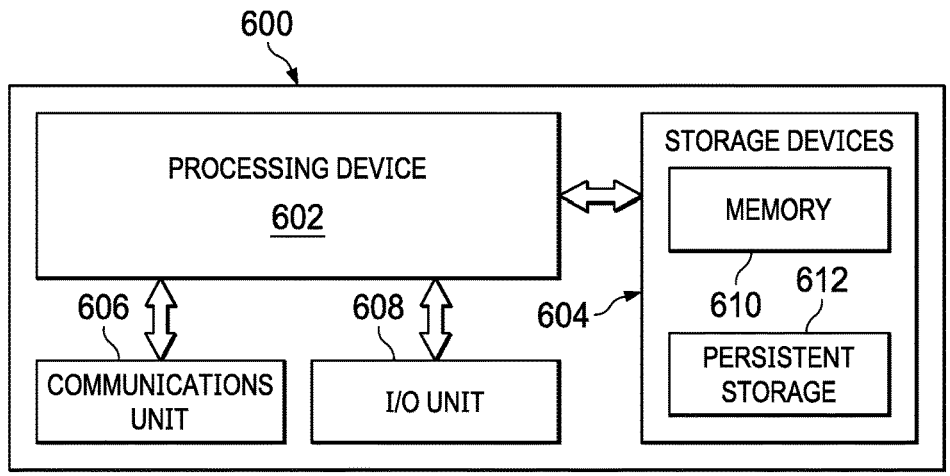
FIG. 6 illustrates an example device for performing a trigger to data synchronization of gigahertz digital-to-analog converters according to this disclosure.

FIG. 6 illustrates an example device 600 for performing a trigger to data synchronization of gigahertz digital-to-analog converters according to this disclosure. One or more instances of the device 600 (or portions thereof) may, for example, be used to at least partially implement the functionality of the system 100 of FIG. 1. However, the functionality of the system 100 may be implemented in any other suitable manner.

As shown in FIG. 6, the device 600 denotes a computing device or system that includes at least one processing device 602, at least one storage device 604, at least one communications unit 606, and at least one input/output (I/O) unit 608. The processing device 602 may execute instructions that can be loaded into a memory 610. The processing device 602 includes any suitable number(s) and type(s) of processors or other devices in any suitable arrangement. Example types of processing devices 602 include one or more microprocessors, microcontrollers, DSPs, ASICs, GPUs, FPGAs, or discrete circuitry.

The memory 610 and a persistent storage 612 are examples of storage devices 604, which represent any structure(s) capable of storing and facilitating retrieval of information (such as data, program code, and/or other suitable information on a temporary or permanent basis). The memory 610 may represent a random access memory or any other suitable volatile or non-volatile storage device(s). The persistent storage 612 may contain one or more components or devices supporting longer-term storage of data, such as a read only memory, hard drive, Flash memory, or optical disc.

The communications unit 606 supports communications with other systems or devices. For example, the communications unit 606 can include a network interface card or a wireless transceiver facilitating communications over a wired or wireless network. The communications unit 606 may support communications through any suitable physical or wireless communication link(s).

The I/O unit 608 allows for input and output of data. For example, the I/O unit 608 may provide a connection for user input through a keyboard, mouse, keypad, touchscreen, or other suitable input device. The I/O unit 608 may also send output to a display or other suitable output device. Note, however, that the I/O unit 608 may be omitted if the device 600 does not require local I/O, such as when the device 600 can be accessed remotely or operated autonomously.

In some embodiments, the instructions executed by the processing device 602 can include instructions that implement all or portions of the functionality of the system 100 described above. For example, the instructions executed by the processing device 602 can include instructions for performing a trigger-to-data synchronization of gigahertz digital-to-analog converters as described above.

Although FIG. 6 illustrates one example of a device 600 for performing a trigger to data synchronization of gigahertz digital-to-analog converters, various changes may be made to FIG. 6. For example, computing devices and systems come in a wide variety of configurations, and FIG. 6 does not limit this disclosure to any particular computing device or system.

In some embodiments, various functions described in this patent document are implemented or supported by a computer program that is formed from computer readable program code and that is embodied in a computer readable medium. The phrase "computer readable program code" includes any type of computer code, including source code, object code, and executable code. The phrase "computer readable medium" includes any type of medium capable of being accessed by a computer, such as read only memory (ROM), random access memory (RAM), a hard disk drive (HDD), a compact disc (CD), a digital video disc (DVD), or any other type of memory. A "non-transitory" computer readable medium excludes wired, wireless, optical, or other communication links that transport transitory electrical or other signals. A non-transitory computer readable medium includes media where data can be permanently stored and media where data can be stored and later overwritten, such as a rewritable optical disc or an erasable storage device.

It may be advantageous to set forth definitions of certain words and phrases used throughout this patent document. The terms "application" and "program" refer to one or more computer programs, software components, sets of instructions, procedures, functions, objects, classes, instances, related data, or a portion thereof adapted for implementation in a suitable computer code (including source code, object code, or executable code). The term "communicate," as well as derivatives thereof, encompasses both direct and indirect communication. The terms "include" and "comprise," as well as derivatives thereof, mean inclusion without limitation. The term "or" is inclusive, meaning and/or. The phrase "associated with," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, have a relationship to or with, or the like. The phrase "at least one of," when used with a list of items, means that different combinations of one or more of the listed items may be used, and only one item in the list may be needed. For example, "at least one of: A, B, and C" includes any of the following combinations: A, B, C, A and B, A and C, B and C, and A and B and C.

The description in the present application should not be read as implying that any particular element, step, or function is an essential or critical element that must be included in the claim scope. The scope of patented subject matter is defined only by the allowed claims. Moreover, none of the claims invokes 35 U.S.C. § 112(f) with respect to any of the appended claims or claim elements unless the exact words "means for" or "step for" are explicitly used in the particular claim, followed by a participle phrase identifying a function. Use of terms such as (but not limited to) "mechanism," "module," "device," "unit," "component," "element," "member," "apparatus," "machine," "system," "processor," or "controller" within a claim is understood and intended to refer to structures known to those skilled in the relevant art, as further modified or enhanced by the features of the claims themselves, and is not intended to invoke 35 U.S.C. § 112(f).

While this disclosure has described certain embodiments and generally associated methods, alterations and permutations of these embodiments and methods will be apparent to those skilled in the art. Accordingly, the above description of example embodiments does not define or constrain this disclosure. Other changes, substitutions, and alterations are also possible without departing from the spirit and scope of this disclosure, as defined by the following claims.

What is claimed is:

1. A method comprising:
   receiving, at a radar timing card, radar timing information and a synchronous clock signal;
   generating, using the radar timing card, a timing trigger to indicate a time of transmission for radar return information;
   receiving, at each of multiple digital-to-analog converter (DAC) channels of one or more DAC cards, the synchronous clock signal and the timing trigger; and
   simultaneously transmitting, from each of the DAC channels, a dedicated portion of the radar return information based on the time of transmission indicated by the timing trigger,
   wherein the synchronous clock signal is used to align the simultaneous transmissions of the DAC channels on the one or more DAC cards.

2. The method of claim 1, further comprising:
   calculating, using multiple processors, the radar return information;
   dividing, using the multiple processors, the radar return information into the dedicated portions for the DAC channels; and
   converting, using the DAC channels, the dedicated portions of the radar return information for transmission.

3. The method of claim 1, wherein each of the DAC channels transmits the respective dedicated portion of the radar return information over multiple DAC channels.

4. The method of claim 1, further comprising:
   aligning, using multiple delay controls, the timing trigger to the DAC channels.

5. The method of claim 1, further comprising:
   tracking, using a sync counter of each of the DAC channels, a trigger-to-data frame timing; and
   framing, using the sync counter of each of the DAC channels, parallel data to be sent to multiple DAC channels based on the trigger-to-data frame timing.

6. The method of claim 1, further comprising:
   performing, using adjustable delay logic of each of the DAC channels, channel-to-channel alignment in parallel data paths.

7. The method of claim 6, further comprising:
   converting, using multiple DAC channels on multiple DAC cards, the respective dedicated portion of the radar return information; and
   adjusting, using the adjustable delay logic of each of the DAC cards, a delay for each of the DAC channels for alignment of the multiple DAC channels.

8. An apparatus comprising:
   a radar timing card configured to receive radar timing information and a synchronous clock signal and generate a timing trigger to indicate a time of transmission for radar return information; and
   multiple digital-to-analog converter (DAC) channels of one or more DAC cards, each of the DAC channels configured to receive the synchronous clock signal, receive the timing trigger, and transmit a dedicated portion of the radar return information based on the time of transmission indicated by the timing trigger,
   wherein the apparatus is configured to use the synchronous clock signal to align the simultaneous transmissions of the DAC channels on the one or more DAC cards.

9. The apparatus of claim 8, further comprising:
   multiple processors configured to calculate the radar return information and divide the radar return information into the dedicated portions for the DAC channels,
   wherein the DAC channels are further configured to convert the dedicated portions of the radar return information for transmission.

10. The apparatus of claim 8, wherein each of the DAC channels is configured to transmit the respective dedicated portion of the radar return information over multiple DAC channels.

11. The apparatus of claim 8, further comprising:
    multiple delay controls configured to align the timing trigger to the DAC channels.

12. The apparatus of claim 8, wherein each of the DAC channels corresponds to a sync counter configured to:
    track a trigger-to-data frame timing; and
    frame parallel data to be sent to multiple DAC channels based on the trigger-to-data frame timing.

13. The apparatus of claim 8, wherein each of the DAC channels corresponds to adjustable delay logic configured to perform channel-to-channel alignment in parallel data paths.

14. The apparatus of claim 13, further comprising:
multiple DAC cards each including multiple DAC channels configured to convert the respective dedicated portion of the radar return information,
wherein the adjustable delay logic corresponding to each of the DAC channels is configured to adjust a delay for each of the DAC channels for alignment of the multiple DAC channels.

15. A system comprising:
a radar unit configured to generate a system clock signal;
a clock synchronizer configured to convert the system clock signal into a synchronous clock signal; and
a closed-loop radar computer comprising:
   a radar timing card configured to receive radar timing information and the synchronous clock signal and generate a timing trigger to indicate a time of transmission for radar return information; and
   multiple digital-to-analog converter (DAC) channels of one or more DAC cards, each of the DAC channels configured to receive the synchronous clock signal, receive the timing trigger, and transmit a dedicated portion of the radar return information based on the time of transmission indicated by the timing trigger,
wherein the closed-loop radar computer is configured to use the synchronous clock signal to align the simultaneous transmissions of the DAC channels on the one or more DAC cards.

16. The system of claim 15, further comprising:
multiple processors configured to calculate the radar return information and divide the radar return information into the dedicated portions for the DAC channels,
wherein the DAC channels are further configured to convert the dedicated portions of the radar return information for transmission.

17. The system of claim 15, further comprising:
multiple delay controls configured to align the timing trigger to the DAC channels.

18. The system of claim 15, wherein each of the DAC channels comprises a sync counter configured to:
track a trigger-to-data frame timing; and
frame parallel data to be sent to multiple DAC channels based on the trigger-to-data frame timing.

19. The system of claim 15, wherein each of the DAC channels corresponds to adjustable delay logic configured to perform channel-to-channel alignment in parallel data paths.

20. The system of claim 19, wherein the closed-loop radar computer further includes:
multiple DAC cards each including multiple DAC channels configured to convert the respective dedicated portion of the radar return information; and
wherein the adjustable delay logic corresponding to each of the DAC cards is configured to adjust a delay for each of the DAC channels for alignment of the multiple DAC channels.

\* \* \* \* \*